(12) United States Patent
Denis

(10) Patent No.: US 9,865,795 B1
(45) Date of Patent: Jan. 9, 2018

(54) PROCESS FOR FABRICATION OF SUPERCONDUCTING VIAS FOR ELECTRICAL CONNECTION TO GROUNDPLANE IN CRYOGENIC DETECTORS

(71) Applicant: The United States of America as represented by the Administrator of the National Aeronautics and Space Administration, Washington, DC (US)

(72) Inventor: Kevin L. Denis, Crofton, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 15/281,371

(22) Filed: Sep. 30, 2016

(51) Int. Cl.
| | | |
|---|---|---|
| *H01L 39/24* | (2006.01) |
| *H01L 21/308* | (2006.01) |
| *H01L 39/12* | (2006.01) |
| *H01L 21/768* | (2006.01) |
| *H01L 21/3065* | (2006.01) |
| *H01L 21/18* | (2006.01) |
| *H01L 21/027* | (2006.01) |
| *H01L 23/532* | (2006.01) |
| *H01L 23/522* | (2006.01) |

(52) U.S. Cl.
CPC ...... *H01L 39/2406* (2013.01); *H01L 21/0273* (2013.01); *H01L 21/185* (2013.01); *H01L 21/3065* (2013.01); *H01L 21/3081* (2013.01); *H01L 21/76891* (2013.01); *H01L 23/5226* (2013.01); *H01L 23/53285* (2013.01); *H01L 39/12* (2013.01)

(58) Field of Classification Search
None
See application file for complete search history.

(56) References Cited

U.S. PATENT DOCUMENTS

| | | | | |
|---|---|---|---|---|
| 4,075,756 | A * | 2/1978 | Kircher | H01L 21/02175 205/122 |
| 5,001,108 | A * | 3/1991 | Taguchi | H01L 23/532 257/32 |
| 5,069,748 | A * | 12/1991 | Przybysz | H01L 23/53285 216/16 |

(Continued)

*Primary Examiner* — Asok K Sarkar
(74) *Attorney, Agent, or Firm* — Christopher O. Edwards; Bryan A. Geurts; Mark P. Dvorscak

(57) ABSTRACT

Disclosed are systems, methods, and non-transitory computer-readable storage media for fabrication of silicon on insulator (SOI) wafers with a superconductive via for electrical connection to a groundplane. Fabrication of the SOI wafer with a superconductive via can involve depositing a superconducting groundplane onto a substrate with the superconducting groundplane having an oxidizing layer and a non-oxidizing layer. A layer of monocrystalline silicon can be bonded to the superconducting groundplane and a photoresist layer can be applied to the layer of monocrystalline silicon and the SOI wafer can be etched with the oxygen rich etching plasma, resulting in a monocrystalline silicon top layer with a via that exposes the superconducting groundplane. Then, the fabrication can involve depositing a superconducting surface layer to cover the via.

19 Claims, 4 Drawing Sheets

(56) References Cited

U.S. PATENT DOCUMENTS

| | | | |
|---|---|---|---|
| 6,060,664 A * | 5/2000 | Tanahashi | H01L 23/53285 |
| | | | 174/125.1 |
| 2017/0098682 A1* | 4/2017 | Ladizinsky | B82Y 10/00 |
| 2017/0179193 A1* | 6/2017 | Tolpygo | H01L 27/18 |

* cited by examiner

PROCESS FOR FABRICATION OF SUPERCONDUCTING VIAS FOR ELECTRICAL CONNECTION TO GROUNDPLANE IN CRYOGENIC DETECTORS

BACKGROUND

1. Technical Field

The present disclosure relates to fabricating superconductive circuitry and more specifically to a system and method of fabricating a superconductive via for electrical connection to a groundplane.

2. Introduction

The present disclosure relates to fabricating superconducting circuitry. Certain applications require the fabrication of silicon on insulator (SOI) wafers with a superconductive via for electrical connection to a groundplane. Known techniques for fabricating a via that exposes a groundplane of the SOI wafer involve using an etching plasma that oxidizes the groundplane. Consequently, current techniques require in-situ removal of the oxidation prior to depositing a superconducting surface layer that covers the via. However, the process (e.g. sputter etch) to remove the oxide is too long and involves unwanted removal materials from the SOI wafer. Accordingly, what is needed in the art is an improved system and method related to how to fabricate SOI wafers with a superconductive via for electrical connection to a groundplane that avoids removal of oxidation from the groundplane after the etching process.

SUMMARY

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Disclosed are systems, methods, and non-transitory computer-readable storage media for fabrication of silicon on insulator (SOI) wafers with a superconductive via for electrical connection to a groundplane. Fabrication of the SOI wafer with a superconductive via can involve depositing a superconducting groundplane onto a substrate with the superconducting groundplane having an oxidizing layer and a non-oxidizing layer on top of the oxidizing layer. Next, a layer of monocrystalline silicon can be bonded to the superconducting groundplane and a photoresist layer can be applied to the layer of monocrystalline silicon. The photoresist layer can have a pattern with a gap that exposes a portion of the layer of the monocrystalline silicon. In some cases, the photoresist layer is re-flowed at a first edge of the gap and a second edge of the gap to form rounded edges and rehydrated prior to etching.

Then, the photoresist layer and the exposed portion of the layer of the monocrystalline silicon can be etched with the oxygen rich etching plasma, resulting in a monocrystalline silicon top layer with a via that exposes the superconducting groundplane. The oxygen rich etching plasma can be a sulfur hexafluoride plasma effective for etching the silicon and an oxygen plasma effective for etching the photoresist layer. Further the sulfur hexafluoroide plasma and the oxygen plasma can be in a ratio that is observed to etch the photoresist layer laterally and to etch the layer of monocrystalline silicon vertically, resulting in the via having sloped edges.

After etching the photoresist layer and the exposed portion of the layer of the monocrystalline silicon to expose the superconducting groundplane with the via, the fabrication can involve depositing a superconducting surface layer to cover the via.

DETAILED DESCRIPTION

Figure 1A:
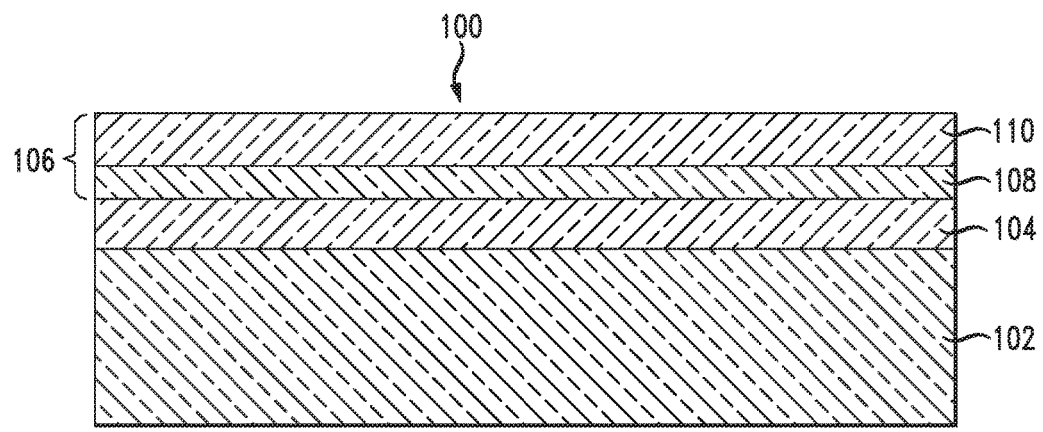
FIGS. 1A-1F illustrate various stages of development of the SOI wafer according to the present disclosure.

A system, method and computer-readable media are disclosed which related to a process for fabricating a superconducting via on a silicon on insulator (SOI) wafer. Various embodiments of the disclosure are described in detail below. While specific implementations are described, it should be understood that this is done for illustration purposes only. Other components and configurations may be used without parting from the spirit and scope of the disclosure. Also, throughout the description, the superconducting layer is often described as a groundplane; however, the disclosed technology can be used to make a superconducting contact between any two superconducting metals separated by a monocrystalline silicon dielectric. FIGS. 1A-1F illustrate an SOI wafer at different steps in a fabrication process and FIG. 2 illustrates a method 200 according to an aspect of this disclosure. As the figures are closely tied together, we shall discuss FIG. 2 with many references to features of FIGS. 1A-1F. As shown in FIG. 2, the method 200 involves depositing a superconducting groundplane onto a substrate 210. This step 210 is shown in FIG. 1A which illustrates an SOI wafer 100 with a polymer layer 104 between a substrate 102 and a superconducting groundplane layer 106. As explained in greater detail below, the superconducting groundplane can include an oxidizing layer 108 and a non-oxidizing layer 110 on top of the oxidizing layer 108. For example, the oxidizing layer 104 can be a niobium layer with a thickness ranging between 0.1 microns and 0.3 microns and the non-oxidizing layer comprises a molybdenum nitride layer with a thickness ranging between 0.2 microns and 0.4 microns.

Next, the method 200 involves bonding a layer of monocrystalline silicon to the superconducting groundplane 220. The monocrystalline layer can be the device layer of the SOI wafer. An SOI wafer can include a device layer and a handle layer both silicon separated by a silicon oxide layer. The device layer can thinner than the handle wafer, e.g. the device layer can be 5 micrometers thick, the handle wafer can be ~400 micrometers thick, and the SiO2 layer can be 0.3 micrometers thick. Also, the ground plane can be deposited on the device layer and the SOI wafer can be bonded to another silicon wafer using a polymer. Further, the handle layer and the SiO2 layer of the SOI wafer can be removed by lapping and chemical etching and the resulting structure can include a silicon wafer with a polymer insulator a superconducting groundplane and a monocrystalline silicon dielectric as shown in FIG. 1B.

Figure 1B:
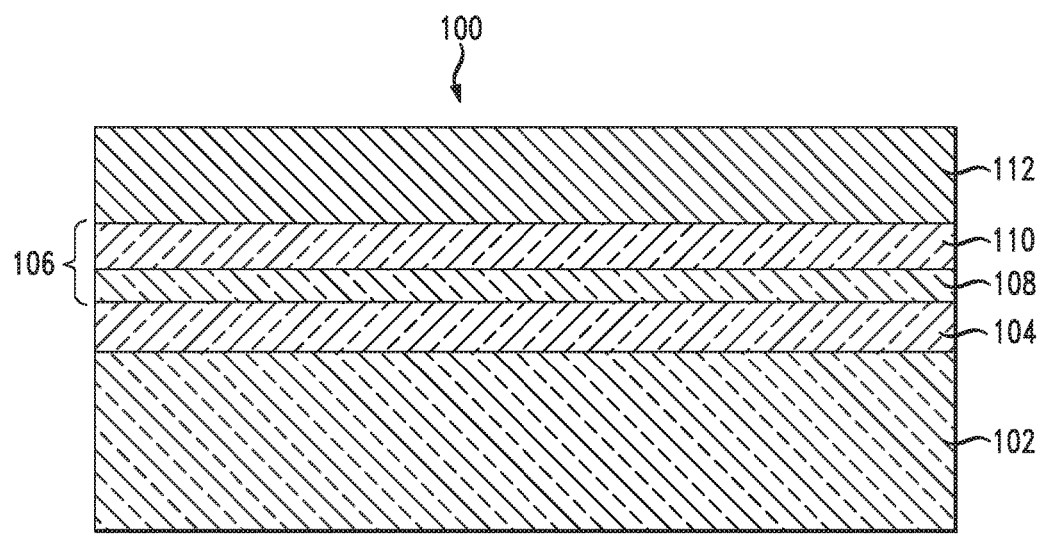
Figure 1C:
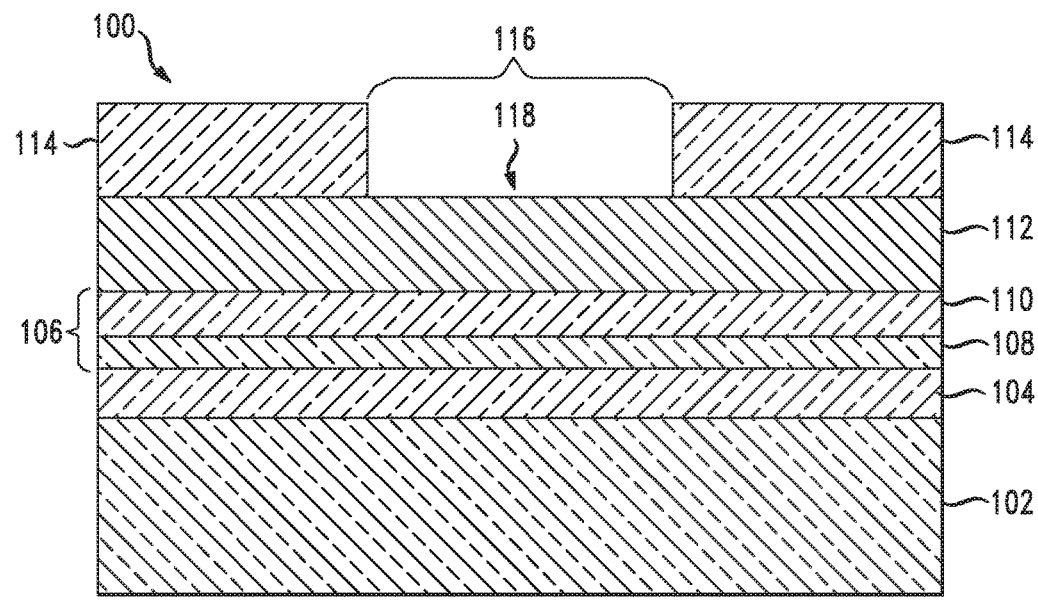
Figure 1D:
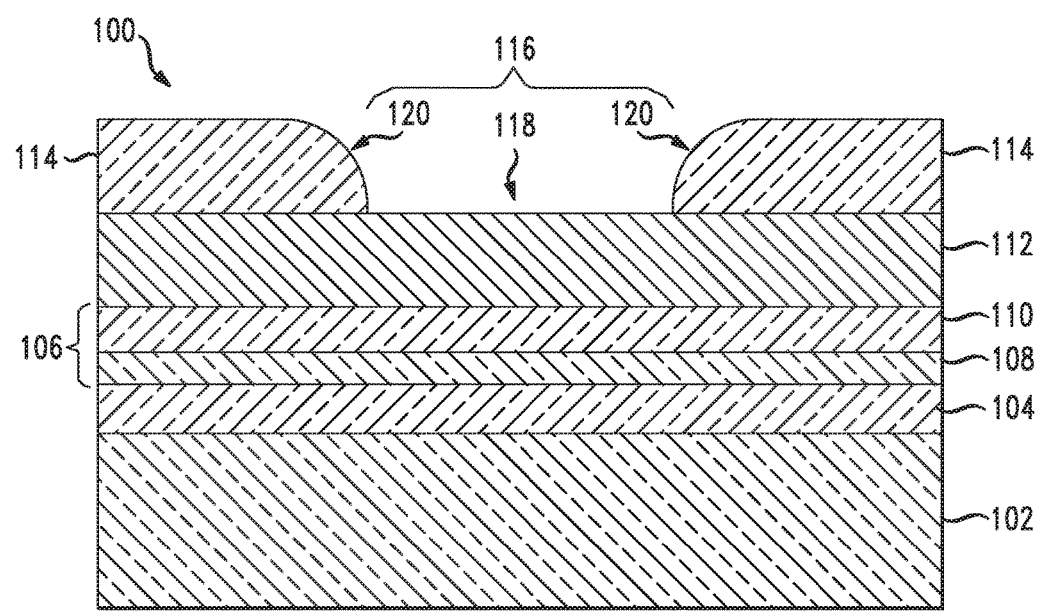
Figure 2:
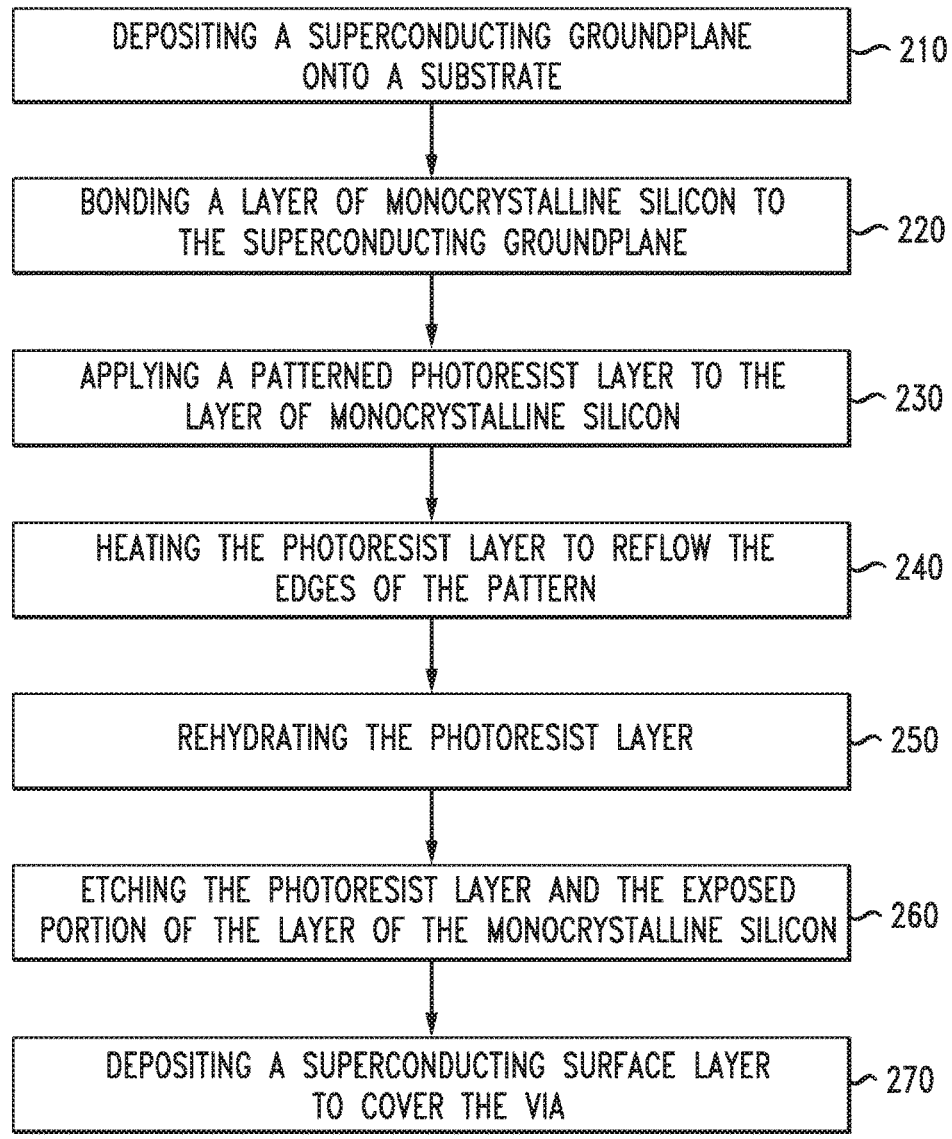
FIG. 2 illustrates a method example.

Step 220 is shown in FIG. 1B which illustrates the SOI wafer 100 with a layer of monocrystalline silicon 112 bonded to the non-oxidizing layer 110 of the superconducting groundplane 106. Then, the method 200 involves applying a patterned photoresist layer to the layer of monocrystalline silicon 230. The photoresist layer can have a substantially rectangular pattern that also defines one or more gaps in the photoresist layer which expose a portion of the layer of the monocrystalline silicon. This step 230 is shown in FIG. 1C which illustrates the SOI wafer 100 with a photoresist layer 114 applied to the layer of monocrystalline silicon 112. The photoresist layer 114 is shown with a pattern that defines a gap 116 that exposes a portion 118 of the layer of the monocrystalline silicon 114. Also, the method 200 can involve heating the photoresist layer to reflow the edges of the pattern 240. This step 240 is shown in FIG. 1D which illustrates the SOI wafer 100 with a photoresist layer 114 having rounded edges 120. The rounded edges 120 of the photoresist layer 114 facilitate evenly sloped edges, as explained in greater detail below. Next, the method 200 can involve rehydrating the photoresist layer 250 in a high-humidity (e.g., ~50% humidity) atmosphere.

Figure 1E:
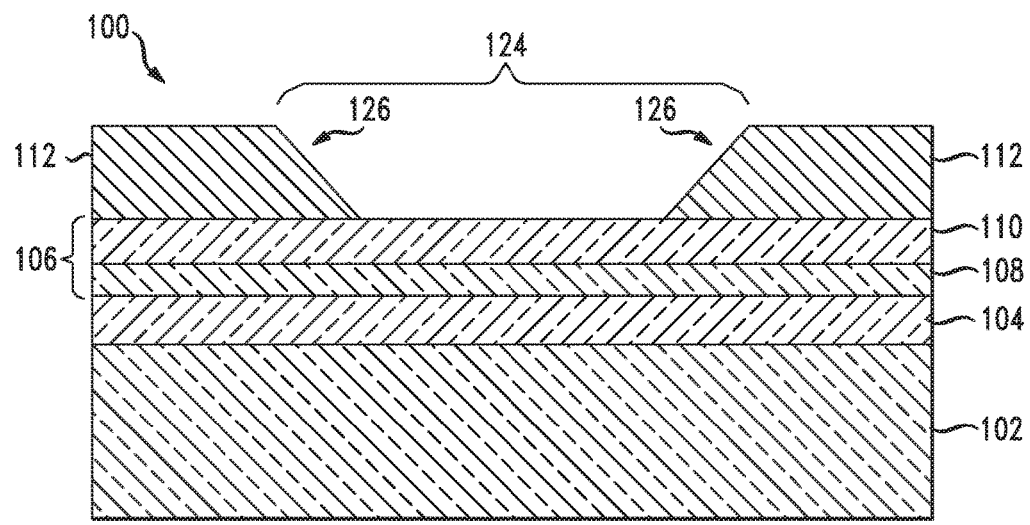

After the photoresist layer 114 of the SOI wafer 100 is reflowed and rehydrated, the method 200 can involve etching the photoresist layer and the exposed portion of the layer of the monocrystalline silicon 260. Etching the exposed portion of the layer of the monocrystalline silicon results in a via that exposes the superconducting groundplane. This step 260 is shown in FIG. 1E which illustrates the SOI wafer 100 with a via 124 created in the layer of monocrystalline silicon 112 that exposes the superconducting groundplane 106. Also, an etching plasma can be selected to evenly etch the photoresist layer laterally and etch the layer of monocrystalline silicon vertically, resulting in the via 124 having sloped edges 126.

Figure 1F:
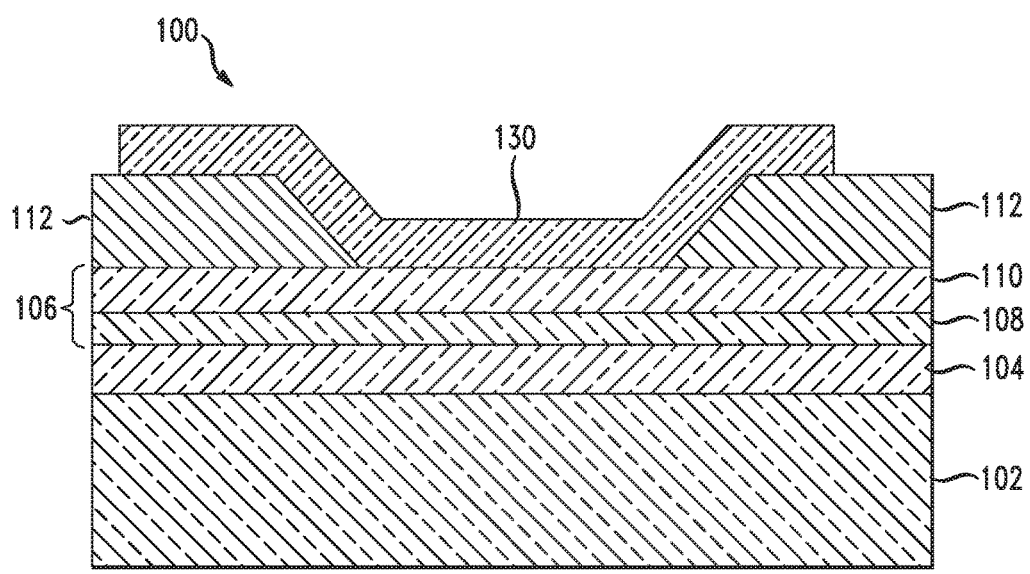

Finally, the method 200 involves depositing a superconducting surface layer to cover the via 270. This step 270 is shown in FIG. 1F which illustrates the SOI wafer 100 with a superconducting surface layer 130 covering the via 124 and creating a superconducting connection to the superconducting groundplane 106. In some cases, the superconducting surface layer 130 is a niobium surface layer with a thickness ranging between 0.2 microns and 0.4 microns.

In some cases, the etching plasma includes a combination of sulfur hexafluoride plasma effective for etching the silicon and an oxygen plasma effective for etching the photoresist layer. Also, favorable results have been observed when the sulfur hexafluoride is applied at a rate substantially equal to 27 standard cubic centimeters per minute, when the oxygen plasma is applied at a rate substantially equal to 48 standard cubic centimeters per minute, and when the etching plasmas are applied at a power substantially equal to 100 Watts and at a pressure substantially equal to 300 millitor.

As explained above, the via 124 created in the layer of monocrystalline silicon 112 exposes the superconducting groundplane 106. So, when oxygen rich etching plasma is used in the etching process, the superconducting groundplane 106 is exposed to high concentrations of oxygen. Consequently, when the superconducting groundplane 106 is a superconducting material that is observed to oxidize when exposed to oxygen, the etching plasma can oxidize the superconducting groundplane 106 resulting in a contact resistance between the superconducting groundplane 106 and a superconducting surface layer that is deposited over the via 124. Accordingly, the present technology involves a superconducting groundplane 106 with a non-oxidizing layer 110 on top of the oxidizing layer 108.

In a specific example, a 250 nm molybdenum nitride non-oxidizing layer 110 is deposited on an niobium oxidizing layer 108. The molybdenum nitride non-oxidizing layer 110 can act as both an etch stop and as a material that is less likely to oxidize in the sloped sidewall silicon etch. Molybdenum nitride films deposited by sputtering are superconducting with Tc around 6.5K. Also, the molybdenum nitride can be cleaned prior to a superconducting surface layer (e.g. a second niobium layer) deposition using a reverse bias RF in situ plasma cleaning step at 250 W, 4 mtorr and 5 min.

Embodiments within the scope of the present disclosure may also include tangible and/or non-transitory computer-readable storage media for carrying or having computer-executable instructions or data structures stored thereon. Such tangible computer-readable storage media can be any available media that can be accessed by a general purpose or special purpose computer, including the functional design of any special purpose processor as described above. By way of example, and not limitation, such tangible computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection to a computer, the computer properly views the connection as a computer-readable medium. Thus, any such connection is properly termed a computer-readable medium.

Computer-executable instructions include, for example, instructions and data which cause a general purpose computer, special purpose computer, or special purpose processing device to control a group of components to perform a certain function or group of functions. Such components can include a spin coater, a wafer bonder, a physical vapor deposition tool—for instance, a sputtering deposition system, a mechanical lapper, a deep reactive ion etcher, and a programmable hot plate. Other components can also be used which would be known to those of skill in the art. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Any such computing device will include the basic hardware components such as a processor, a bus, memory, input/output devices, and so forth. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. Various modifications and changes may be made to the principles described herein without following the example embodiments and applications illustrated and described herein, and without departing from the spirit and scope of the disclosure.

I claim:

1. A method comprising:
depositing a superconducting groundplane onto a substrate, wherein the superconducting groundplane comprises an oxidizing layer that is observed to oxidize when exposed to an oxygen rich etching plasma and a non-oxidizing layer on top of the oxidizing layer, the non-oxidizing layer comprising a material that is observed to resist oxidation when exposed to the oxygen rich etching plasma;
bonding a layer of monocrystalline silicon to the superconducting groundplane;
applying a photoresist layer to the layer of monocrystalline silicon, the photoresist layer having a pattern that comprises a gap in the photoresist layer that exposes a portion of the layer of the monocrystalline silicon to yield an exposed portion of the layer of the monocrystalline silicon; and
etching the photoresist layer and the exposed portion of the layer of the monocrystalline silicon with the oxygen rich etching plasma, resulting in a monocrystalline silicon top layer with a via that exposes the superconducting groundplane.

2. The method of claim 1, further comprising:
reflowing the photoresist layer at a first edge of the gap and a second edge of the gap to form rounded edges.

3. The method of claim 2, further comprising:
re-hydrating the photoresist layer in an atmosphere having a humidity ranging between 40% and 60%.

4. The method of claim 1, wherein the pattern is a substantially rectangular shape.

5. The method of claim 1, wherein the oxygen rich etching plasma comprises a sulfur hexafluoride plasma effective for etching the silicon and an oxygen plasma effective for etching the photoresist layer, the sulfur hexafluoride plasma and the oxygen plasma having a ratio that is observed to etch the photoresist layer laterally and to etch the layer of monocrystalline silicon vertically, resulting in the via having sloped edges.

6. The method of claim 5, wherein the sulfur hexafluoride plasma is applied at a rate substantially equal to 27 standard cubic centimeters per minute.

7. The method of claim 5, wherein the oxygen plasma is applied at a rate substantially equal to 48 standard cubic centimeters per minute.

8. The method of claim 5, wherein the oxygen rich etching plasma is applied at a power substantially equal to 100 Watts and at a pressure substantially equal to 300 millitorr.

9. The method of claim 1, wherein the oxidizing layer comprises a niobium layer with a thickness ranging between 0.1 microns and 0.3 microns.

10. The method of claim 1, the non-oxidizing layer comprises a molybdenum nitride layer with a thickness ranging between 0.2 microns and 0.4 microns.

11. The method of claim 1, wherein the silicon layer is bonded to the superconducting groundplane using a polymer with a thickness ranging between 0.8 microns and 1.2 microns.

12. The method of claim 1, further comprising:
depositing a superconducting surface layer to cover the via.

13. The method of claim 12, wherein the superconducting surface layer comprises a niobium surface layer with a thickness ranging between 0.2 microns and 0.4 microns.

14. A system comprising:
a processor; and
a computer-readable storage device storing instructions which, when executed by the processor, cause the processor to perform operations comprising:
depositing a superconducting groundplane onto a substrate, wherein
the superconducting groundplane comprises an oxidizing layer that is observed to oxidize when exposed to an oxygen rich etching plasma and a non-oxidizing layer on top of the oxidizing layer, the non-oxidizing layer comprising a material that is observed to resist oxidation when exposed to the oxygen rich etching plasma;
bonding a layer of monocrystalline silicon to the superconducting groundplane;
applying a photoresist layer to the layer of monocrystalline silicon, the photoresist layer having a pattern that comprises a gap in the photoresist layer that exposes a portion of the layer of the monocrystalline silicon to yield an exposed portion of the layer of the monocrystalline silicon;
etching the photoresist layer and the exposed portion of the layer of the monocrystalline silicon with the oxygen rich etching plasma, resulting in a monocrystalline silicon top layer with a via that exposes the superconducting groundplane; and
depositing a superconducting surface layer to cover the via.

15. The system of claim 14, wherein the oxygen rich etching plasma comprises a sulfur hexafluoride plasma effective for etching the silicon and an oxygen plasma effective for etching the photoresist layer, the sulfur hexafluoride plasma and the oxygen plasma having a ratio that is observed to etch the photoresist layer laterally and to etch the layer of monocrystalline silicon vertically, resulting in the via having sloped edges.

16. The system of claim 14, wherein the sulfur hexafluoride plasma is applied at a rate substantially equal to 27 standard cubic centimeters per minute, wherein the oxygen plasma is applied at a rate substantially equal to 48 standard cubic centimeters per minute, and wherein the oxygen rich etching plasma is applied at a power substantially equal to 100 Watts and at a pressure substantially equal to 300 millitorr.

17. A computer-readable storage device storing instructions which, when executed by a processor, cause the processor to control a group of components to perform operations comprising:
depositing a superconducting groundplane onto a substrate, wherein the superconducting groundplane comprises an oxidizing layer that is observed to oxidize when exposed to an oxygen rich etching plasma and a non-oxidizing layer on top of the oxidizing layer, the non-oxidizing layer comprising a material that is observed to resist oxidation when exposed to the oxygen rich etching plasma;

bonding a layer of monocrystalline silicon to the superconducting groundplane;

applying a photoresist layer to the layer of monocrystalline silicon, the photoresist layer having a pattern that comprises a gap in the photoresist layer that exposes a portion of the layer of the monocrystalline silicon to yield an exposed portion of the layer of the monocrystalline silicon;

etching the photoresist layer and the exposed portion of the layer of the monocrystalline silicon with the oxygen rich etching plasma, resulting in a monocrystalline silicon top layer with a via that exposes the superconducting groundplane; and depositing a superconducting surface layer to cover the via.

18. The computer-readable storage device of claim 17, wherein the oxygen rich etching plasma comprises a sulfur hexafluoride plasma effective for etching the silicon and an oxygen plasma effective for etching the photoresist layer, the sulfur hexafluoride plasma and the oxygen plasma having a ratio that is observed to etch the photoresist layer laterally and to etch the layer of monocrystalline silicon vertically, resulting in the via having sloped edges.

19. The computer-readable storage device of claim 17, wherein the sulfur hexafluoride plasma is applied at a rate substantially equal to 27 standard cubic centimeters per minute, wherein the oxygen plasma is applied at a rate substantially equal to 48 standard cubic centimeters per minute, and wherein the oxygen rich etching plasma is applied at a power substantially equal to 100 Watts and at a pressure substantially equal to 300 millitorr.

* * * * *